United States Patent
Gupta

(10) Patent No.: US 7,888,757 B2
(45) Date of Patent: Feb. 15, 2011

(54) MAGNETIC RANDOM ACCESS MEMORY (MRAM) DEVICE ON THERMALLY-SENSITIVE SUBSTRATE

(75) Inventor: Arunava Gupta, Valley Cottage, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/923,874

(22) Filed: Oct. 25, 2007

(65) Prior Publication Data
US 2008/0055790 A1   Mar. 6, 2008

Related U.S. Application Data

(62) Division of application No. 10/459,517, filed on Jun. 12, 2003, now Pat. No. 7,494,896.

(51) Int. Cl.
*H01L 29/82* (2006.01)
*H01L 43/00* (2006.01)

(52) U.S. Cl. ............... 257/421; 257/295; 257/E21.665; 438/455

(58) Field of Classification Search ............ None
See application file for complete search history.

(56) References Cited

U.S. PATENT DOCUMENTS

| 4,017,265 | A | 4/1977 | Taylor |
| 6,114,088 | A | 9/2000 | Wolk et al. |
| 6,210,479 | B1 | 4/2001 | Bojarczuk et al. |
| 6,420,242 | B1 | 7/2002 | Cheung et al. |
| 6,501,143 | B2 | 12/2002 | Sato et al. |
| 6,521,511 | B1 | 2/2003 | Inoue et al. |
| 6,723,165 | B2 | 4/2004 | Ogawa et al. |
| 6,946,178 | B2 | 9/2005 | Sheats et al. |
| 6,972,204 | B2 | 12/2005 | Oohata et al. |
| 6,992,869 | B2 | 1/2006 | Suzuki et al. |

FOREIGN PATENT DOCUMENTS

| CN | 1231065 A | 10/1999 |
| KR | 2000-0068418 | 11/2000 |

OTHER PUBLICATIONS

Supratik Guha, et al., "Transplanted Si Films on Arbitrary Substrates Using GaN Underlayers", Applied Physics Letters, vol. 76, No. 10, Mar. 6, 2000, pp. 1264-1266.
Chinese Office Action dated Mar. 27, 2009.

*Primary Examiner*—Zandra Smith
*Assistant Examiner*—Khanh B Duong
(74) *Attorney, Agent, or Firm*—Vazken Alexanian; McGinn IP Law Group, PLLC

(57) ABSTRACT

A method of forming a magnetic memory device (and a resulting structure) on a low-temperature substrate, includes forming the memory device on a transparent substrate coated with a decomposable material layer subject to rapid heating resulting in a predetermined high pressure, and transferring the memory device to the low-temperature substrate.

15 Claims, 2 Drawing Sheets

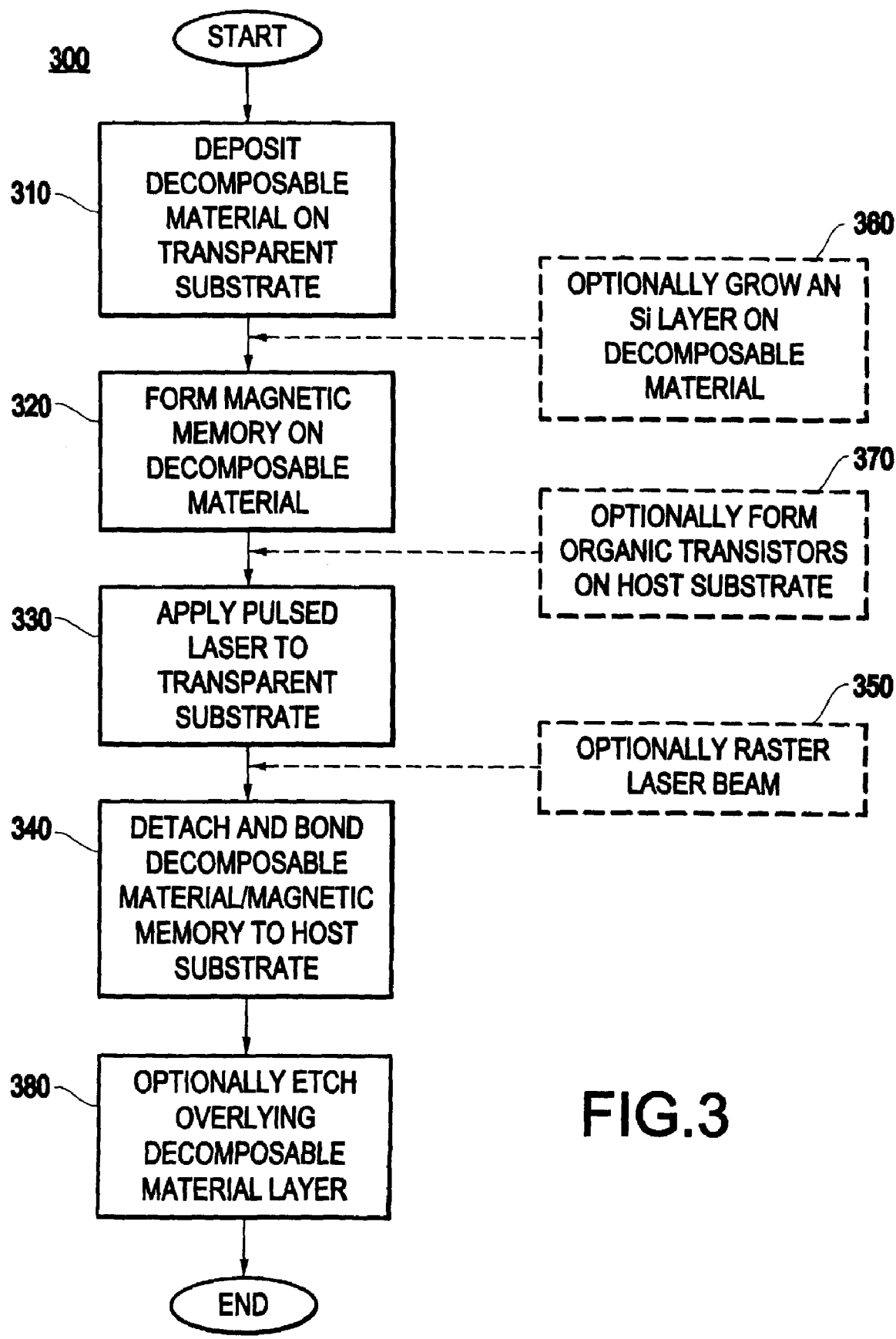

MAGNETIC RANDOM ACCESS MEMORY (MRAM) DEVICE ON THERMALLY-SENSITIVE SUBSTRATE

The present application is a Divisional Application of U.S. patent application Ser. No. 10/459,517, filed Jun 12, 2003 now U.S. Pat. No. 7,494,896.

BACKGROUND OF THE INVENTION

1. Field of the Invention

The present invention generally relates to magnetic memory devices, and more particularly to MRAM devices, in which a magnetic tunnel junction (MTJ) device is transplanted onto a thermally-sensitive substrate.

2. Description of the Related Art

MRAMs are presently fabricated on Si for integration of magnetic tunnel junctions (MTJs) with complementary metal oxide semiconductor (CMOS) technology. MTJ devices can potentially provide nonvolatile, dense, high-performance storage elements. Lower performance applications of MTJs, such as in "smart cards", "wearable sensors", and the like, would require fabrication of such MTJs on flexible, thermally-sensitive substrates, such as polymers and plastics. However, the thermal budget required (e.g., between about 250 to about 400.degree. C.) during processing of the MTJ devices precludes direct fabrication on these substrate materials. That is, the processing of such devices are not compatible with the low-temperature substrates.

Additionally, present day smart cards made of plastic have one or more semiconductor chips, including memory, attached to a module embedded in the card. Having the circuit directly imprinted or bonded to the card would make them more mechanically flexible, durable and lightweight. Cost is also an important factor for low performance application. Replacement of silicon chips with cheaper methods of fabricating memory circuits on plastics would be preferred. However, prior to the invention, no such method has been provided.

SUMMARY OF THE INVENTION

In view of the foregoing and other problems, drawbacks, and disadvantages of the conventional methods and structures, a feature of the present invention is to provide a method and structure in which applications of magnetic memory devices (MRAM device arrays, MRAM stacks, MTJs, etc.) requiring fabrication of such devices (e.g., MTJs etc.) on flexible, standard (e.g., thermally-sensitive such as low-temperature) substrates, such as polymers and plastics, is made possible.

Another feature is to provide a structure and method in which the MTJ device can be fabricated directly on such substrate materials.

In a first exemplary aspect of the present invention, a method of forming a magnetic memory device (and a resulting structure) on a low-temperature substrate, includes forming the memory device on a transparent substrate coated with a decomposable material layer subject to rapid heating resulting in a predetermined high pressure, and transferring the memory device to the low-temperature substrate.

In a second exemplary aspect of the present invention, a method of making a magnetic tunnel junction (MTJ) device on a thermally-sensitive substrate, includes coating a transparent substrate, having a MTJ device thereon, with a nitride material, and transferring the MTJ device to the low-temperature substrate using a laser lift-off process.

In a third exemplary aspect of the present invention, a magnetic memory device, includes a transparent substrate having decomposable material coated thereon, a device formed on the transparent substrate, and a low-temperature substrate for receiving the device, after the decomposable material is subjected to a predetermined high pressure.

In a fourth exemplary aspect of the present invention, a method of forming a magnetic memory device on a low-temperature substrate, includes forming a memory device on a transparent substrate coated with a nitride layer, applying a laser light to the memory device, to subject the nitride layer to pressure, and transferring the memory device to a low-temperature substrate.

Thus, with the unique and unobvious aspects of the present invention, magnetic memory devices (e.g., MRAM devices, MRAM stacks, MTJs, etc.) can be formed advantageously on low-temperature substrates such as plastics, polymers, and the like.

Fabrication of memory circuits for low performance applications using the inventive method can lead to lower cost, flexible, durable and lightweight plastic circuits with potential applications for many devices, including smart cards and wearable sensors.

BRIEF DESCRIPTION OF THE DRAWINGS

The foregoing and other purposes, aspects and advantages will be better understood from the following detailed description of exemplary embodiments of the invention with reference to the drawings, in which:

FIG. 3 illustrates a method 300 of forming an MTJ device on a thermally-sensitive substrate according to an exemplary embodiment of the present invention.

DETAILED DESCRIPTION OF EXEMPLARY EMBODIMENTS OF THE INVENTION

Figure 1:
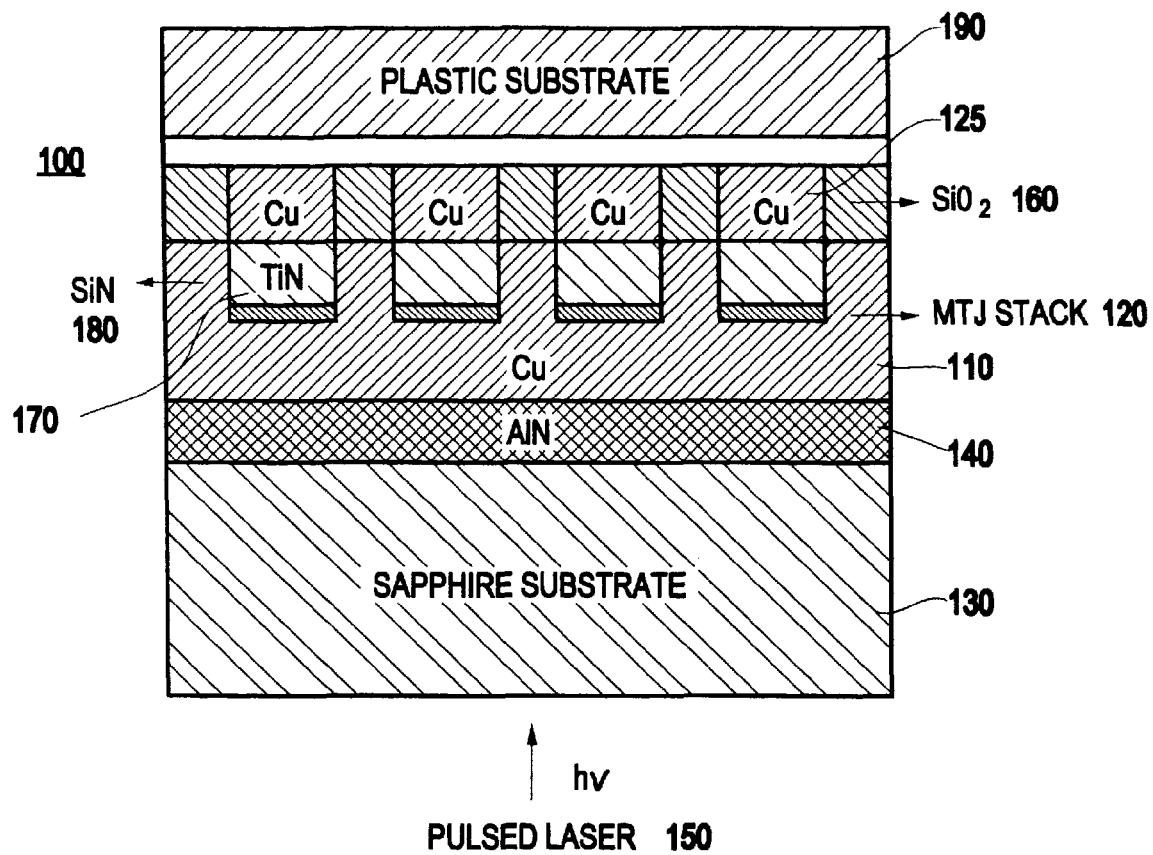
FIG. 1 illustrates an exemplary structure 100 according to an exemplary embodiment of the present invention.
Figure 2:
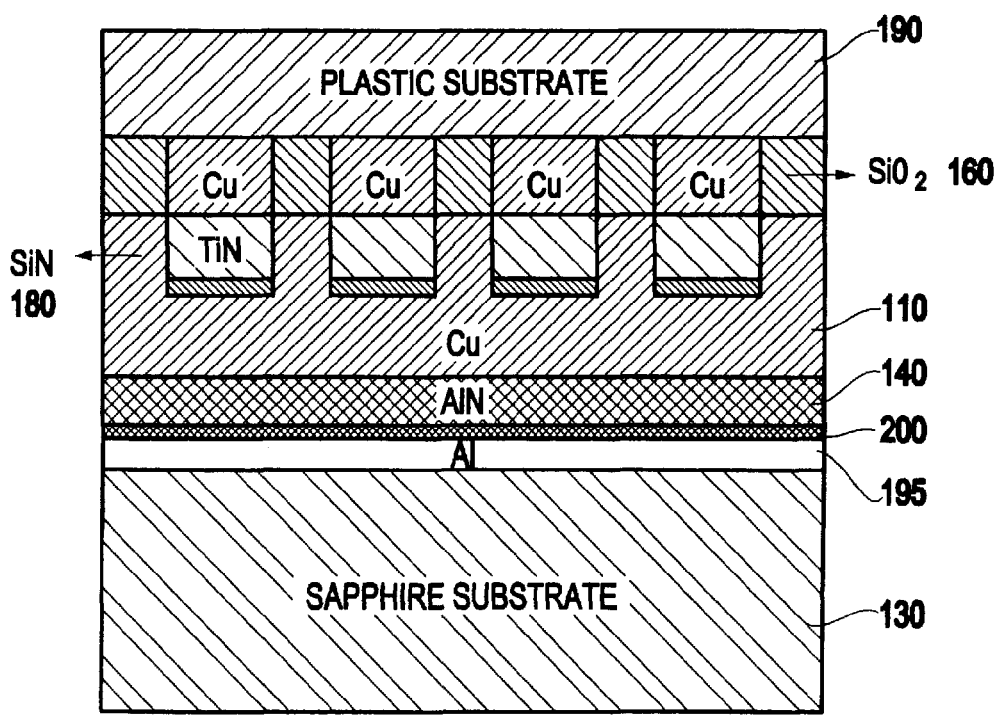
FIG. 2 illustrates the structure 100 after pulsed laser-induced transfer of a magnetic memory device (e.g., an MRAM device array) to a low-temperature substrate, according to an exemplary embodiment of the present invention.

Referring now to the drawings, and more particularly to FIGS. 1-3, there are shown exemplary embodiments of the method and structures according to the present invention.

Exemplary Embodiment

As described below, in an exemplary embodiment of the invention, a method of transplanting MTJ devices onto a standard (e.g., thermally-sensitive) substrate is provided, in which an array of devices fabricated, for example, on a transparent substrate (e.g., quartz, sapphire, etc.), are transferred using an exemplary laser lift-off process.

It is again noted that any substrate can be used so long as the substrate is transparent to laser light. That is, depending upon the substrate, an adequate wavelength of light would be found for transmission. Sapphire is preferable since it transfers over a much wider range of wavelengths.

Turning now to the Figures, and more specifically to FIG. 1, an exemplary MRAM device structure 100 is shown.

Structure 100 includes an underlying conductive (e.g., Cu or the like) wiring 110 along with an MTJ cell 120. The MTJ cell typically includes a bottom contact electrode, a bottom magnetic layer, an oxidized Al barrier, a top magnetic layer and a top contact electrode.

The underlying conductive (e.g., Cu or the like) wiring 110 is fabricated on a transparent (e.g., sapphire, quartz, etc.; hereinafter sapphire will be assumed for exemplary purposes only) substrate 130, preferably coated with a thin blanket layer of nitride material 140. The layer of nitride material 140 preferably includes one or more nitride films selected from the group of gallium nitride, aluminum nitride or indium nitride and/or their alloys.

An insulating layer 160 (e.g., $SiO_2$, SiN, SiON, SiONF and/or the like) may be formed between the upper conductive (e.g., Cu) wirings 125 by etching or the like. Additionally, the upper copper wirings 125 may be formed on a conductive nitride material (e.g., TiN, TaN, WN, and/or the like) or other conducting metal or oxide layer 170. Between the TiN 170/MTJ stack 120 is preferably formed an insulating nitride material 180 (e.g., SiN) or an insulating oxynitride (e.g., SiON).

It is known that laser irradiation of the surface of wide-gap InGaAlN films with above (or near)-band-gap photon energies results in the metallization of the nitride following the reaction:

$$XN = X + 1/2 N_2, \text{ where X represent Ga, Al, or In.}$$

This has been used advantageously in demonstrating that GaN thin films grown on the transparent (sapphire) substrate can be lifted-off from the substrate by metallizing the interface with a laser probe 150 incident through the backside of the substrate (e.g., sapphire) 130.

This approach also has been extended to show that by using the GaN layer as a template to grow layers of Si, the metallization process can be utilized to lift off overgrown Si layers to be deposited onto arbitrary substrates. Efficient film transfer using AlN, InN and their alloys is also expected.

Thus, FIG. 1 illustrates the application of the pulsed laser 150 applied to the MRAM device array, fabricated on a transparent (e.g., sapphire) substrate 130 for transfer of the MRAM device array to a low-temperature substrate (e.g., plastic, polymer, etc.) 190.

FIG. 2 illustrates the structure after pulse laser-induced transfer of the MRAM device array from the transparent substrate 130 to the low-temperature substrate 190, has occurred. As shown, the magnetic memory (MTJ stack) has been formed on the plastic substrate. Additionally the decomposable material (e.g., the nitride material) has decomposed into its substituents via the release of nitrogen. Hence, in the example shown in FIG. 2, there is an aluminum layer 195, and interfacial layer 200 below the nitride material (e.g., AlN) 140.

Turning now to the method 300 of the invention, the decomposable material (e.g., nitride such as AlN, GaN, and/or InN, and their alloys, etc.) film is deposited on a transparent (e.g., sapphire, quartz, etc.) substrate (step 310). It is noted that the deposition can be performed at relatively low temperatures (e.g., room temperature or near room temperature). However, higher temperature could be employed (e.g., to about for example, 250.degree. C.). Regardless of the host substrate used, it is important that the deposition temperature be below the temperature at which the host substrate would begin to degrade or delaminate.

It is noted that the nitride film should be of sufficient thickness so that the laser light (e.g., depending upon the laser light used) is absorbed in the nitride film. It is noted that some of the nitride may remain on the MRAM after the transfer, and can be removed at that time or left behind. That is, the nitride should not be so thin that the MRAM stack is damaged by the laser light being completely absorbed in the MRAM. Thus, preferably the nitride film has a thickness of about 100 .ANG. to about 2000 .ANG.

In step 320, the magnetic memory device (e.g., MRAM arrays, MRAM stack, MTJs etc. depending upon the desired applications) along with the conductive (e.g., Cu. etc.) wiring are formed on top of the nitride surface. The MRAM device arrays preferably are complete such that substantially no further processing (or minimum processing) is required after the transfer. That is, preferably, the MRAM device is completely fabricated and processed on the sapphire substrate.

During the transfer process, the top copper wiring (with any additional insulating top layer) is mounted face down onto a low-temperature (e.g., polymer or plastic) host substrate in very close proximity. It is preferable to coat a thin layer of an elastomer material, such as polydimethylsiloxane (PDMS) on the host substrate to enable intimate contact between the two substrates during the transfer process. The two surfaces can also be bonded using an epoxy or other mechanism.

In step 330, preferably a single pulse of laser radiation, preferably near or above the band gap of the decomposable material (e.g., nitride), will result in a metallization of the interfacial nitride. It is noted that the laser light may be a patterned beam of laser light on the order of 200-400 mJ/cm.sup.2 (e.g., a fairly large beam) useful for the local transfer.

As a result of such metallization, in step 340, the nitride/MRAM structure will detach from the transparent (e.g., sapphire, quartz, etc.) and adhere to the host substrate (e.g., plastic, polymer, etc.). For the laser, preferably an excimer laser is employed, for producing a pulse having a duration on the order of tenths of nanoseconds (or less).

Along these lines, a laser having a wavelength of 193 nm or 248 nm could be used. By the same token, any short pulse laser could be used, which allows the light to be absorbed in the nitride material could be used. Thus, in a very short time period, the thin layer of nitride material is heated up and subsequently decomposed (e.g., broken up into its constituent elements). The debonding occurs due to the pressure build up with the release of nitrogen from the nitride metallization.

It is noted that, by optionally rastering the laser beam, different MRAM arrays can be transferred using single pulses (step 350).

Additionally, by optionally growing an Si layer on top of the nitride (step 360), depending upon the geometry involved, the MRAM devices can also be integrated with transistors to control operation of the cells, which are then be transferred simultaneously. The silicon layer can be epitaxial, polycrystalline, or amorphous depending on the growth temperature of the silicon and the underlying nitride material. Epitaxial-quality wide band gap nitrides can be grown on sapphire. Subsequent growth of silicon on this nitride layer will be substantially single crystal in nature and of better crystalline quality than the amorphous or polycrystalline silicon. Thus, transistors fabricated in the grown silicon with the MRAM devices on top can be transferred at the same time.

Alternatively, optional organic transistors can be fabricated on the host substrate (e.g., the low-temperature substrate such as plastic, polymer, etc.) prior to transfer of the MRAM arrays (step 370) and interconnected with the transferred MRAM structure.

After the transfer process, optionally (e.g., depending on the designer's requirements) the overlying nitride layer can be etched away using established dry or wet etching techniques (step 380).

An issue of the inventive laser transfer process is the temperature rise of the MRAM structure and also that of the host substrate. The temperature rise can be estimated based on the known thermodynamic and thermal properties of the nitride film and the sapphire substrate.

For example, for an energy fluence of .about.300 mJ/cm.sup.2 from an excimer laser at 248 nm, the maximum temperature rise at a distance of 0.5 .mu.m is about 150.degree. C. for conduction through sapphire (and about 350.degree. C. for conduction through quartz). The temperature is rapidly quenched to below 100.degree. C. (within 0.1 .mu.s) for the case of sapphire. Thus, the temperature rise is not very severe, and can be controlled by the thickness of the nitride layer.

Thus, the invention provides a method (and resulting structure) in which a magnetic memory device (e.g., MRAM device array, MRAM stack, MTJ cell, etc.) is formed on a substrate transparent to laser light, with a thin nitride layer on the bottom which absorbs the laser light and which decomposes due to the high pressure, etc., thereby facilitating the transfer of the MRAM device array to a low-temperature substrate.

While the invention has been described in terms of several exemplary embodiments, those skilled in the art will recognize that the invention can be practiced with modification within the spirit and scope of the appended claims.

Further, it is noted that Applicant's intent is to encompass equivalents of all claim elements, even if amended later during prosecution.

Transplanted magnetic random access memory (MRAM) devices on thermally-sensitive substrates using laser transfer and method for making the same.

What is claimed:

1. A magnetic memory device, comprising:
    a transparent substrate having decomposable material coated thereon;
    a device formed on said transparent substrate, said device comprising:
        a first conductive wiring;
        a magnetic tunnel junction coupled to said first conductive wiring; and
        a second conductive wiring fabricated on the transparent substrate;
    a low-temperature substrate for receiving the device, after the decomposable material is subjected to a predetermined high pressure; and
    an organic transistor disposed on the low temperature substrate, the organic transistor configured to interconnect with the device after the decomposable material is subjected to the predetermined high pressure.

2. The magnetic memory device of claim 1, wherein said decomposable material comprises a nitride material.

3. The magnetic memory device of claim 2, wherein said nitride material comprises Gallium nitride.

4. The magnetic memory device of claim 2, wherein said nitride material comprises Aluminum nitride.

5. The magnetic memory device of claim 2, wherein said decomposable material has a thickness between about 100 .ANG. to about 2000 .ANG.

6. The magnetic memory device of claim 2, wherein the nitride material includes one or more nitride films comprising at least one of gallium nitride, aluminum nitride, indium nitride and their alloys.

7. The magnetic memory device according to claim 1, wherein said low temperature substrate comprises a plastic substrate.

8. The magnetic memory device according to claim 1, wherein said transparent substrate comprises a sapphire substrate.

9. The magnetic memory device according to claim 1, wherein said transparent substrate comprises a quartz substrate.

10. The magnetic memory device according to claim 1, wherein said transparent substrate is transparent to laser light, and said laser light is absorbed by said decomposable material layer.

11. The magnetic memory device according to claim 1, wherein the device is formed on a surface of the decomposable material layer.

12. The magnetic memory device according to claim 1, wherein the device, along with a conductive wiring, is formed on a surface of the decomposable material layer.

13. The magnetic memory device according to claim 1, wherein the device directly contacts a surface of the decomposable material layer.

14. The magnetic memory device according to claim 1, further comprising a top conductive wiring mounted on the device.

15. The magnetic memory device according to claim 1, further comprising a top conductive wiring mounted face down to the low temperature substrate.

* * * * *